(12) United States Patent
Niu et al.

(10) Patent No.: US 7,889,707 B2
(45) Date of Patent: *Feb. 15, 2011

(54) METHOD AND SYSTEM FOR UNEQUAL ERROR PROTECTION WITH BLOCK CODES FOR WIRELESS TRANSMISSION

(75) Inventors: Huaning Niu, Sunnyvale, CA (US); Chiu Ngo, San Francisco, CA (US)

(73) Assignee: Samsung Electronics Co., Ltd., Suwon (KR)

( * ) Notice: Subject to any disclaimer, the term of this patent is extended or adjusted under 35 U.S.C. 154(b) by 805 days.

This patent is subject to a terminal disclaimer.

(21) Appl. No.: 11/906,350

(22) Filed: Oct. 2, 2007

(65) Prior Publication Data

US 2009/0086699 A1 Apr. 2, 2009

(51) Int. Cl.
*H04L 12/28* (2006.01)
*H04B 7/216* (2006.01)

(52) U.S. Cl. ............... 370/342; 370/238; 370/389; 370/392; 370/473

(58) Field of Classification Search ......... 370/208–473; 714/752–801
See application file for complete search history.

(56) References Cited

U.S. PATENT DOCUMENTS

2007/0204205 A1  8/2007  Niu et al.

OTHER PUBLICATIONS

Wu, Y. et al., "A Vacation Model with Setup and Close-down Times for Transmitter Buffer of ARQ Schemes," 14th IEEE Proceedings on Personal, Indoor and Mobile Radio Communications (PIMRC), Sep. 7-10, 2003, pp. 2054-2058, vol. 3.
Gallant, M. et al., "Rate-Distortion Optimized Layered Coding with Unequal Error Protection for Robust Internet Video," IEEE Transaction on Circuits and Systems for Video Technology, Mar. 2001, pp. 357-372, vol. 11, No. 3.
Mohr, A. et al., "Unequal Loss Protection: Graceful Degradation of Image Quality over Packet Erasure Channels Through Forward Error Correction," IEEE Journal on Selected Areas in Communications, Jun. 2000, pp. 819-828, vol. 18, No. 6.
Van Veen, B. et al., "Beamforming: A Versatile Approach to Spatial Filtering," IEEE ASSP Magazine, Apr. 1988, pp. 4-24, vol. 5, No. 2.

*Primary Examiner*—Afsar M. Qureshi
(74) *Attorney, Agent, or Firm*—Kenneth L. Sherman, Esq.; Michael Zarrabian, Esq.; Myers Andras Sherman & Zarrabian LLP

(57) ABSTRACT

A method and system for wireless data communication is provided, which involves constructing a data payload containing data, partitioning the data payload into fragments, performing block code encoding on each fragment, wherein at least one fragment is encoded at a different coding gain than another fragment, and transmitting the data payload including encoded fragments over a wireless channel.

31 Claims, 7 Drawing Sheets

400

METHOD AND SYSTEM FOR UNEQUAL ERROR PROTECTION WITH BLOCK CODES FOR WIRELESS TRANSMISSION

FIELD OF THE INVENTION

The present invention relates to wireless communications, and in particular, to application of unequal error protection to wireless communications.

BACKGROUND OF THE INVENTION

With the proliferation of high quality video, an increasing number of electronic devices (e.g., consumer electronics (CE) devices) utilize high definition (HD) video. Conventionally, most devices compress the HD video, which can be around 1 Gbps (gigabits per second) in bandwidth, to a fraction of its size to allow for transmission between devices. However, with each compression and subsequent decompression of the video, some video information can be lost and the picture quality is degraded.

Existing Wireless Local Area Networks (WLANs) and similar technologies do not provide the bandwidth needed to carry uncompressed HD video. Other networks can suffer from interference issues when several devices are connected, leading to video signal degradation. Therefore, a system which can wirelessly interconnect devices for reliable transmission of uncompressed video, without degrading the picture quality, is desirable.

In many wireless communication systems, a frame structure is used for data transmission between a transmitter and a receiver. For example, the IEEE 802.11 standard uses frame aggregation in a Media Access Control (MAC) layer and a physical (PHY) layer. FIG. 1 shows a general framing structure 10 for a wireless communication system including one or more transmitters and one or more receivers. In a typical transmitter, a MAC layer receives a MAC Service Data Unit (MSDU) 11 from an upper layer and attaches a MAC header 12 thereto, in order to construct a MAC Protocol Data Unit (MPDU) 13. The MAC header 12 includes information such as a source address (SA) and a destination address (DA). The MPDU 13 is a part of a PHY Service Data Unit (PSDU) 14 and is transferred to a PHY layer in the transmitter to attach a PHY header 16 (PHY-SIG) thereto to construct a PHY Protocol Data Unit (PPDU) 18. The PHY header 16 includes parameters for determining a transmission scheme including a coding/modulation scheme. Further, before transmission as a packet from a transmitter to a receiver, a training sequence 19 is attached to the PPDU 18, wherein the training sequence 19 can include channel estimation and synchronization information. The PHY header 16 and the training sequence 19 form a PHY preamble 17.

For reliable data transmission, conventionally forward error correction (FEC) has been applied to all transmitted data bits equally in an attempt to protect such data against transmission errors. However, in such schemes, when the bit error rate of the channel exceeds the correction capability of FEC codes, a "cliff" effect is observed, resulting in highly degraded video quality.

In some cases, fragmentation is used for combating the effects of fading channels that lead to transmission errors. Fragmentation involves splitting large blocks of data into small frames for transmission. This has the benefit of requiring smaller buffer sizes and allowing earlier detection of errors in a block of data when each buffer is checked for errors. Fragmentation further enables retransmission of smaller frames in case of errors, and prevents one station from occupying the transmission medium too long for transmitting large blocks of data. Fragmentation is usually used together with selective retransmission for better performance.

In a fragmentation scheme, typical retransmission mechanisms use a cyclic redundancy code (CRC) to determine if a fragment is received without error. FIG. 2 shows a conventional PPDU format with multiple fragmentations and CRCs. Specifically, FIG. 2 shows a conventional packet format 20 with a payload 22 split into multiple payload fragments 24 for transmission at a transmitter. A CRC encoder at the transmitter then encodes k bits of information in each fragment into k+n bits, wherein n is the number of CRC bits that is placed in a corresponding CRC field 26 for each CRC fragment 24. The transmitter then transmits the k+n bits of information to a receiver through a wireless channel, wherein the receiver performs a CRC check per received fragment 24 using the CRC bits in the corresponding CRC field 26. The receiver verifies whether the k bits of information in a fragment are received correctly, wherein n bits of error can be detected.

Transmitting such fragments with CRC information from a transmitter to a receiver is often performed in a transmitter MAC layer. Similarly, performing a CRC check at the receiver is often performed at a receiver MAC layer. However, the CRC processing at the MAC layers of the transmitter and the receiver add device cost and operation complexity.

Further, when different levels of error protection are desirable for different data, a simple approach has been adding a separate CRC for each fragment with a different priority. This approach, however, increases the transmission overhead induced because of CRC information, and increases the complexity for multiple CRC checks.

BRIEF SUMMARY OF THE INVENTION

The present invention provides a method and a system for wireless communication of data packets using a fragmentation pattern with block code encoding and unequal error protection. One embodiment involves constructing a data payload containing data, partitioning the data payload into fragments, performing block code encoding on each fragment, wherein at least one fragment is encoded at a different coding gain than another fragment, and transmitting the data payload including encoded fragments over a wireless channel.

Constructing the data payload containing the data may further include appending a MAC header to the data payload to generate a MAC packet. Partitioning the data may include partitioning the data into multiple fragments based on certain criteria, and performing block code encoding may include performing low-density parity-check (LDPC) encoding on each fragment at a coding gain that is based on said criteria.

Partitioning the data payload into fragments may further include partitioning the data payload based on multiple data importance levels, and performing block code encoding may further include performing LDPC encoding on each fragment at a coding gain that is based on the importance level of the data in that fragment, wherein more important data is provided with more error protection. Retransmission of data may be performed by selectively transmitting data in said encoded fragments that is indicated as received in error by a receiver.

DETAILED DESCRIPTION OF THE INVENTION

The present invention provides a method and a system for wireless communication of data packets using a fragmentation pattern with block code encoding and unequal error protection. An example of block code encoding includes low-density parity-check (LDPC) encoding, wherein the error detection capability of LDPC codes allows efficient error detection and selective retransmission of erroneous data. This reduces computation complexity while achieving better error detection than CRC. Unequal error protection allows application of different levels of protection to different data units, further reducing communication overhead.

Although LDPC encoding is used in the example implementations herein to illustrate application of UEP and fragmentation, it should be noted that any other block codes, such as, e.g., Reed-Solomon code or Bose-Chaudhuri-Hochquenghem (BCH) code, can also be used instead of LDPC codes. A block code is a type of channel coding that adds redundancy to a data packet for transmission such that a receiver can decode a received packet with minimal errors.

Figure 1:
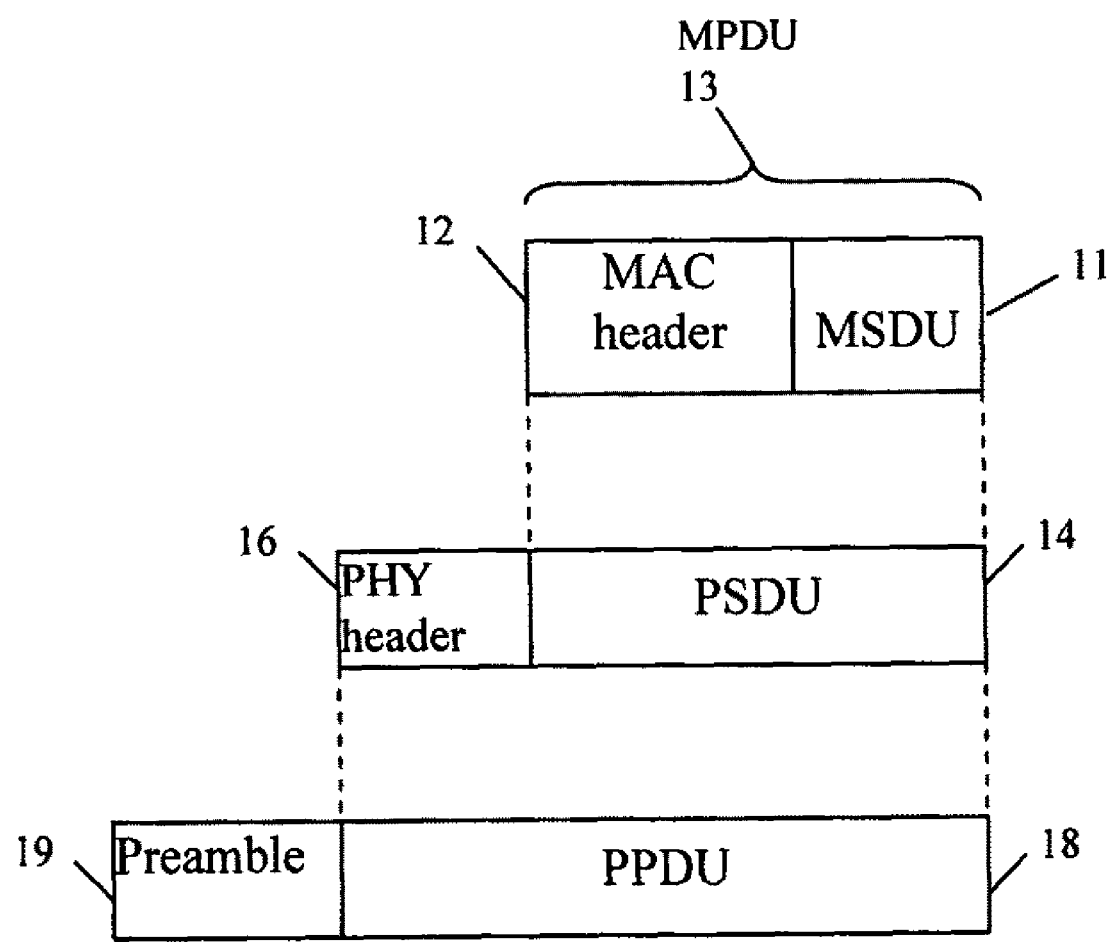
FIG. 1 shows a conventional PPDU frame structure for wireless transmission of data.
Figure 2:
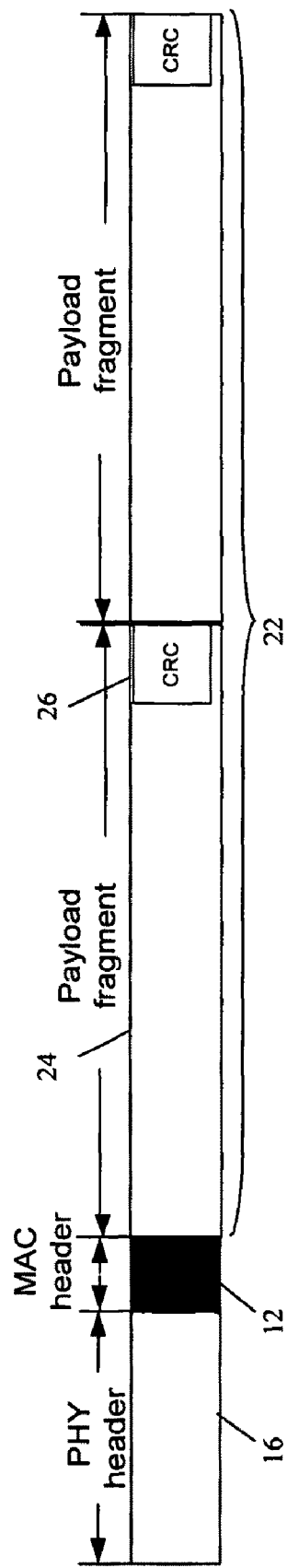
FIG. 2 shows a conventional PPDU format with multiple fragmentation and CRC.
Figure 3:
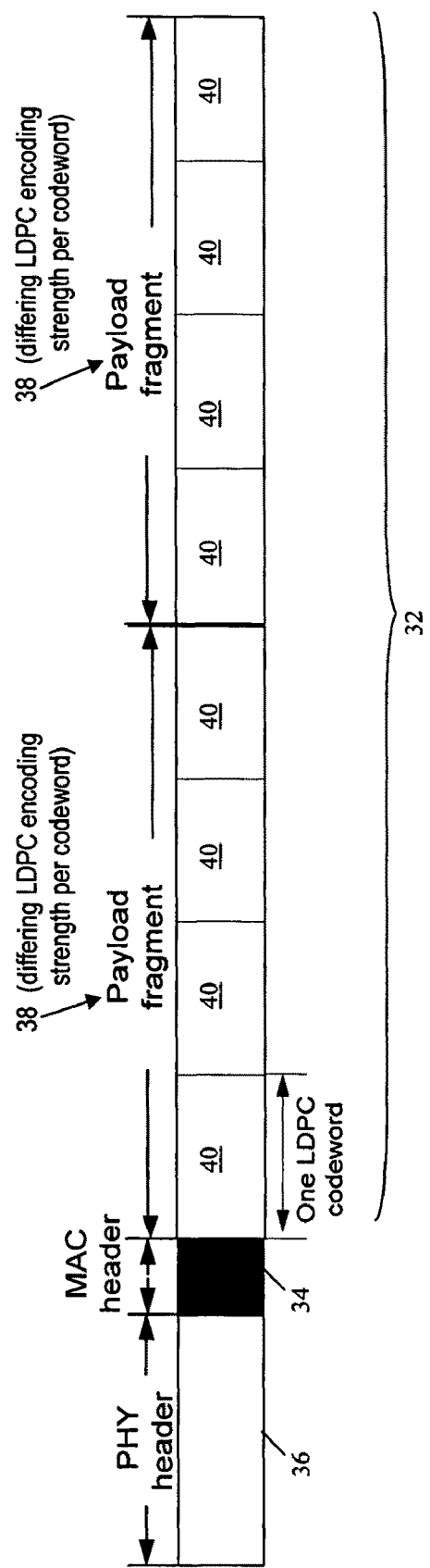
FIG. 3 shows an example of constructing a frame format that uses fragmentation and LDPC codes with unequal error protection, according to an embodiment of the present invention.

FIG. 3 shows a diagrammatical method of constructing a packet 30 using a frame format that employs a fragmentation pattern and unequal error protection with LDPC encoding, according to an embodiment of the present invention. The packet 30 includes a data payload 32, to which a MAC header 34 and a PHY header (a PHY preamble) 36 are appended. Incoming bits are fragmented (partitioned) into payload fragments 38 in the payload 32. Then unequal error protection is implemented by applying varying degrees of LDPC encoding to different fragments, generating one or more codewords 40 per fragment 38.

Then, the packet 30 is transmitted from a transmitter to a receiver over a wireless channel. Upon receiving the packet 30, the receiver decodes the LDPC codewords 40 in each fragment 38. Using the LDPC error detection capability of LDPC codes, the receiver detects bits received in error, and sends acknowledgment (ACK) information to the transmitter accordingly. The acknowledgement information indicates to the transmitter if any of the transmitted bits was received in error, and may therefore be in need of retransmission. The transmitter then selectively retransmits bits indicated as received in error.

In the packet 30, CRC information is not necessary because LDPC codes provide error detection capability. This reduces transmission overhead from a transmitter to a receiver over a communication medium such as a wireless channel (e.g., a radio frequency (RF)).

As noted, each payload fragment 38 can include one or more LDPC codewords 40, wherein the number of codewords 40 per fragment 38 is based on a tradeoff between: (1) the length of the ACK information from a receiver, and (2) retransmission efficiency. In one example, the ACK information comprising a blockACK that includes a bitmap which indicates the presence or absence of error in each fragment (in another example, the bitmap indicates the presence or absence of error in each codeword).

In one data packet communication implementation, said tradeoff is considered as follows. In the first example, for a fixed MSDU size and a fixed LDPC codeword length, if each fragment 38 includes only one LDPC codeword 40, then the fragment size will be small and the number of fragments will be large, whereby the corresponding blockACK bit map is long. The benefit of one LDPC codeword 40 per fragment 38 is that the transmitter requires a minimum transmission buffer size and endures the lowest retransmission overhead. In a second example, if a fragment 38 includes multiple LDPC codewords 40, then the fragment size will be large and the number of fragments will be small, whereby the corresponding blockACK bitmap is short. In this second example, retransmission efficiency and buffer requirements for the transmitter are higher relative to the first example. Such factors are considered in selecting the number of codewords 40 per fragment 38.

As noted, upon receiving the packet 30, the receiver decodes the LDPC codewords 40 in each fragment 38. If the bit error rate (BER) after LDPC decoding is high (e.g., higher than $10^{-3}$), then fewer codewords 40 per fragmentation format 30 (along with a long bitmap in blockACK) is preferable. When the BER after LDPC decoding is low (e.g., less than $10^{-7}$), then more codewords 40 per fragment 38 (along with a short bitmap in blockACK) are preferable.

Figure 4:
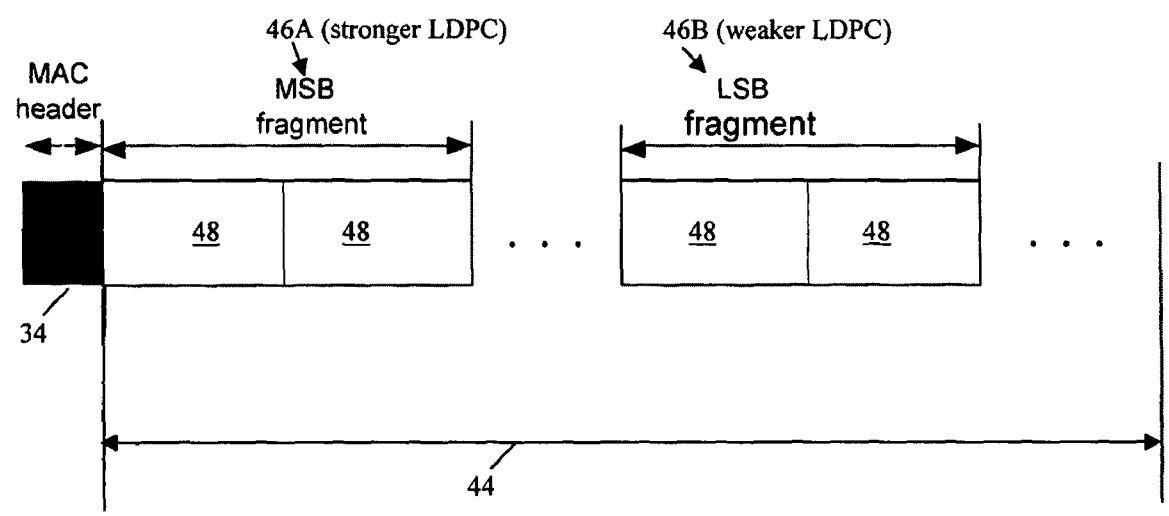
FIG. 4 shows another example of constructing a frame format that uses fragmentation and LDPC codes with unequal error protection, according to an embodiment of the present invention.

FIG. 4 shows another example fragmentation frame format 42 utilizing unequal error protection with LDPC encoding for transmission of video information such as uncompressed video pixels in a data payload 44, according to the present invention. For video pixel data, the payload data is fragmented based on the video importance level of the incoming video data.

In one example, bits at the same video importance level are placed into the same fragment. A typical pixel has three components (e.g., R, G, B), wherein each pixel component comprises D bits. In FIG. 4, for each pixel component, the most significant bits (MSBs) of the D bits are placed in a fixed fragment 46A, and the least significant bits (LSBs) of the D bits are placed in another fixed fragment 46B.

Then unequal error protection is implemented by applying varying degrees of LDPC encoding to different fragments using unequal coding gain. For example, stronger LDPC encoding is applied to the fragment 46A which includes bits with a higher video importance level (i.e., MSBs) than the fragment 46B (i.e., LSBs). After LDPC encoding, each corresponding payload fragment includes one or more LDPC codewords 48. In general, there can be more than two importance levels which indicate perceptual importance (video importance) of different pixel data. For example, there can be multiple MSB fragments and multiple LSB fragments. Further, unequal LDPC encoding can be applied based on other criteria in addition to, or in place of, perceptual importance of the data.

After fragmentation and application of unequal error protection by varying LDPC encoding of the video information based on perceptual importance, the packet 42 is transmitted from a transmitter to a receiver over a wireless channel. Upon receiving the packet 42, the receiver decodes the LDPC codewords 48 in each fragment 46A and 46B. Using the LDPC error detection capability of LDPC codes, the receiver detects bits received in error, and sends ACK information to the transmitter accordingly. The ACK information indicates to the transmitter if any of the transmitted bits (in a fragment or a codeword) was received in error, and is therefore in need of retransmission. The transmitter then selectively retransmits a copy of the fragment or codeword, wherein bits were received in error.

Figure 5:
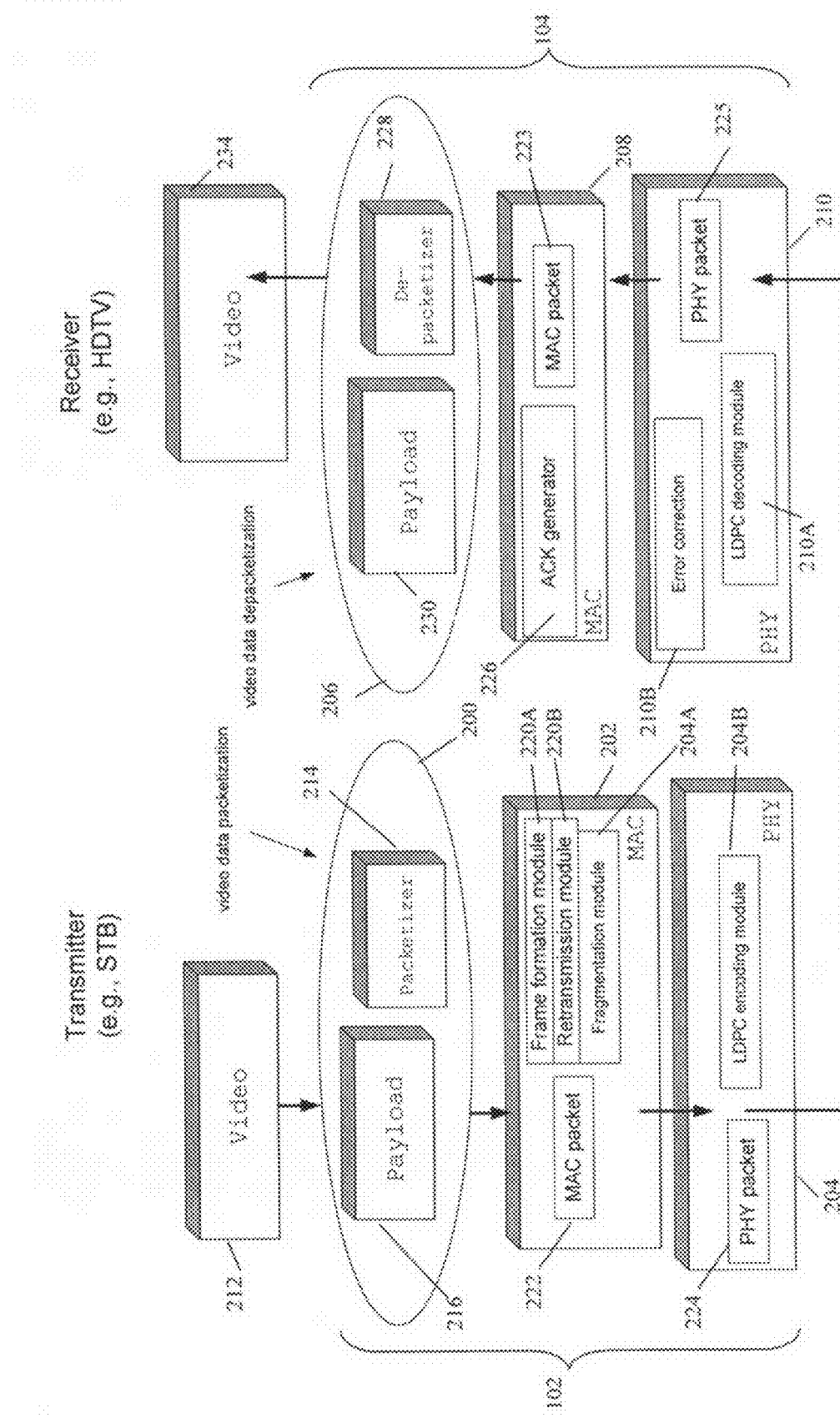
FIG. 5 shows an example functional block diagram of a wireless system for wireless communication of data with a fragmentation pattern and LDPC codes with unequal error protection, according to an embodiment of the present invention.

FIG. 5 shows a functional block diagram of a wireless communication system 100, implementing construction of a packet using a frame format that employs data fragmentation and unequal error protection with LDPC encoding, according to an embodiment of the present invention. The system 100 includes a wireless transmitter (sender) 102 and a wireless receiver 104. The transmitter 102 comprises a packetization module 200, a MAC layer 202 and a PHY layer 204. The receiver 104 comprises a depacketization module 206, a MAC layer 208 and a PHY layer 210.

In this example, the transmitter 102 inputs data such as video information 212 from an upper layer. A packetizer 214 in the packetization module 200 generates a data payload 216 from the video information 212. The data payload 216 is provided to the MAC layer 202, wherein a frame formation module 220A in the MAC layer 202 converts the data payload 216 into a MAC packet 222 that includes a MAC header (e.g., the MAC header 34 in FIG. 3). The MAC layer 202 provides the MAC packet 222 to the PHY layer 204.

The MAC layer 202 includes a fragmentation module 204A that reorders the pixel information into fragments of MSBs and LSBs where each MSB/LSB fragment can contain one or more LDPC codewords (e.g., FIG. 4). The reordering facilitates the retransmission of either MSBs or LSBs. The size of the fragments is a tradeoff between retransmission efficiency, and the length of a blockACK. As noted, the minimum fragment size is limited to one LDPC codeword. A video packet is usually large, ranging from 100K-200K bits, while an LDPC codeword contains around 1K-2K information bits. Using one codeword as one fragment size results in a blockACK of length 100-200 bits from the receiver. Each bit in the blockACK corresponds to one fragment, which is longer than a typical blockACK.

The MAC layer 202 then passes the packet to the PHY layer 204, wherein the PHY layer 204 performs LDPC encoding with unequal error protection. An LDPC encoding module 204B in the PHY layer 204 performs LDPC encoding on the fragments. For example, a stronger LDPC code is applied to a fragment including MSBs, while a weaker LDPC code is applied to a fragment including LSBs. The weaker LDPC code can be a specially designed LDPC code with a particular rate, or punctured from a stronger code. As a result of LDPC encoding, each fragment includes one or more LDPC codewords 40. The PHY layer 204 further adds a PHY header (e.g., the PHY header 36 in FIG. 3) to the MAC packet 222 to generate a PHY packet 224 for transmission to the receiver 104 over a wireless channel.

Use of LDPC codes provides two levels of unequal error protection: (1) PHY level unequal coding gain (FIG. 5), and (2) selective retransmission of more important information (e.g., MSBs), without any additional MAC processing such as calculating the CRC, etc. Alternatively, more than two levels of unequal error protection can be applied by application of additional priority layers. One example involves using three importance levels by grouping (fragmenting) the bits into most significant bits, medium significant bits and least significant bits, and then applying different LDPC encoding codes to each group based on importance level, which provides three levels of unequal error protection.

The PHY layer 210 of the receiver 104 receives the transmitted information, wherein a LDPC decoding module 210A in the PHY layer 210 performs LDPC decoding on the received information using iterative decoding. The basic principle of LDPC iterative decoding is that after each iteration, the decoding module 210A determines whether the LDPC parity check equation is satisfied. If yes, then that iteration is terminated and the codeword is obtained as a correct codeword. Otherwise, the iterations continue until a maximum iteration is reached. If at maximum iteration, the LDPC parity check equation is still not correct, then the codeword is determined as erroneous.

Since the LDPC code is a block code, then in one example using a greater than 1000-bit LDPC codeword increases typically the error detection capability, which is $2d_{min}+1$ (where $d_{min}$ is the minimum hamming distance for the code), to greater than 100 bits of error according to the present invention. This provides better error detection capability than a CRC since a 4-byte CRC can only detect 32 bits of error.

Next, an error correction module 210B performs error correction for erroneous codewords. The error correction can be performed by retransmission of the erroneous codewords using stop-and-wait, go-back-n, selective retransmission, etc. Such error correction can also be used in conjunction with an immediate ACK or a delayed ACK operation implemented by an ACK generator 226 in the MAC layer 208. In one example, the ACK generator 226 generates a blockACK that identifies the erroneous fragments (where at least one codeword of that fragment is erroneous) to the transmitter 102. A retransmission module 220B in the transmitter 102 then performs selective retransmission by retransmitting to the receiver 104 a correct copy of only the fragments identified in the blockACK as erroneous. As such, the transmitter 102 performs selective retransmission with fragmentation (retransmission is also using a fragmented frame format such as in FIG. 3).

Once the erroneous codewords are corrected in the received PHY packet 225, the MAC layer 208 of the receiver constructs a MAC packet 223 and provides the packet payload 230 to the depacketization module 206 whereby a depacketizer module 228 regenerates the video information 234 from the payload. The regenerated video information is provided to the upper layers from the receiver 104.

Figure 6:
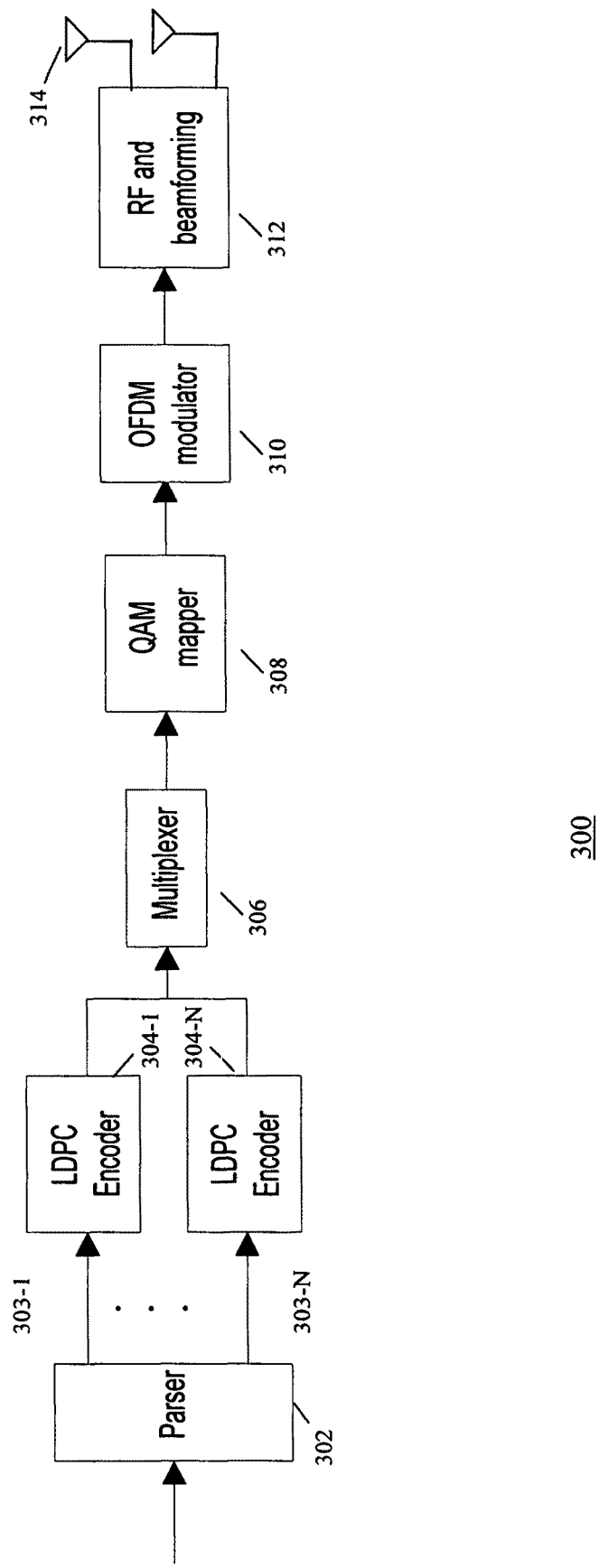
FIG. 6 shows a functional block diagram of an encoding section of an example transmitter in a wireless communication system employing fragmentation and LDPC encoding with unequal error protection, according to an embodiment of the present invention.

FIG. 6 shows a functional block diagram of an encoding section 300 of a transmitter in a wireless communication system employing unequal error protection with LDPC encoding, according to an embodiment of the present invention. The encoding section 300 includes a parser 302, N data paths (e.g., 303-1, . . . , 303-N), a multiplexer 306, a quadrature amplitude modulation (QAM) mapper 308, an orthogonal frequency-division multiplexing (OFDM) modulator 310, and a RF and beamforming module 312. The first data path 303-1 includes a first encoder 304-1 and the $N^{th}$ data path 303-N includes an $N^{th}$ encoder 304-N, wherein N>2.

In one example where N=2, the parser 302 separates the bit stream into two spatial streams: (1) MSBs and (2) LSBs. Depending on the video data format, the parser 302 can be either a bit parser or a group parser. In the first path 303-1, the encoder 304-1 performs strong LDPC encoding on the MSBs while in the second path 303-2, the encoder 304-2 performs weak LDPC encoding on the LSBs. The LDPC encoded bits are then provided to the multiplexer 306, wherein the coded MSB and the coded LSB are multiplexed together for QAM mapping (the coded MSBs and LSBs are multiplexed bit-by-bit or group-by-group by the multiplexer 306). The QAM mapper 308 performs QAM constellation mapping for the multiplexed bits. Additional unequal error protection can be added with specially designed QAM mapping. Then, the OFDM modulator 310 performs orthogonal frequency-division multiplexing on the mapped bit stream to generate several parallel bit streams. Then the parallel bit streams are transmitted using RF modulation with beamforming over antennas 314.

Although in the above example N=2 data paths are described in FIG. 6, the present invention contemplates parsing input bits into more than two data paths, depending on the number of importance levels, N, for the bits.

Figure 7:
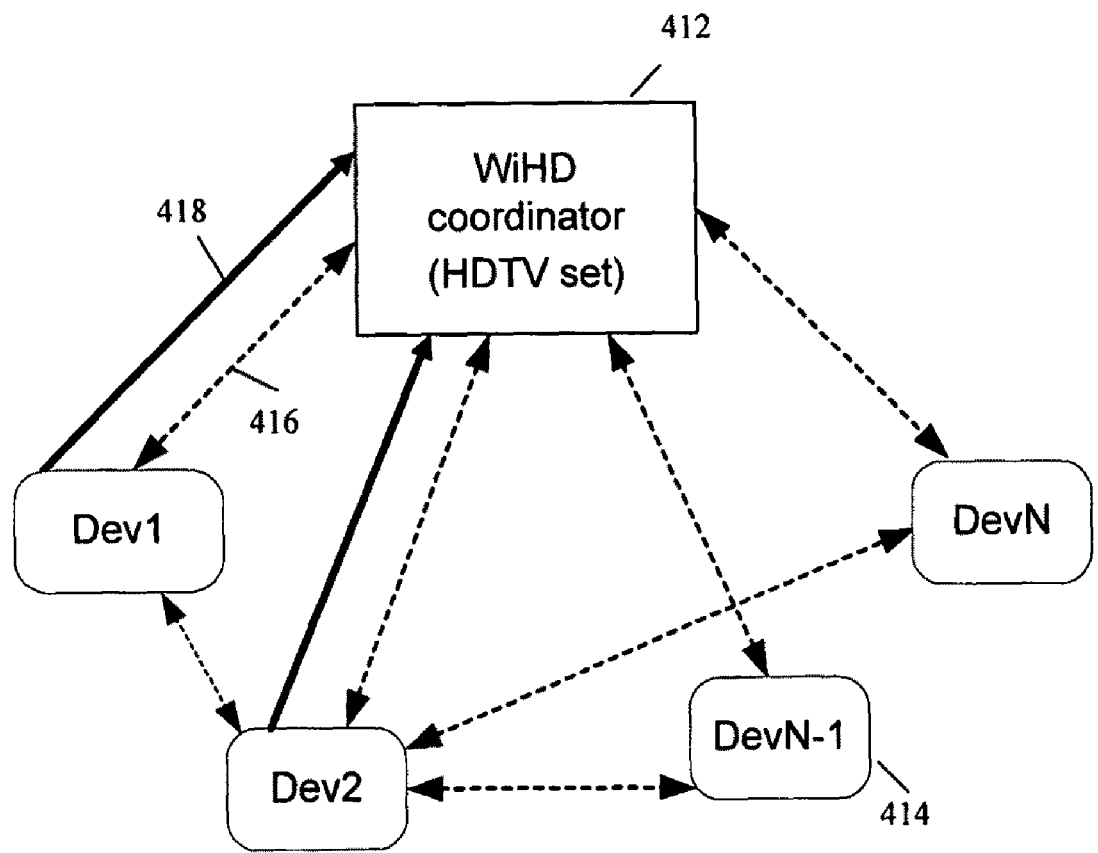
FIG. 7 shows a functional block diagram of a wireless network that implements video transmission between wireless devices utilizing a frame format that implements a fragmentation pattern and LDPC codes with unequal error protection, according to an embodiment of the present invention.

FIG. 7 shows a functional block diagram of a wireless network 400 that implements data communication, according to an embodiment of the present invention. An example implementation for a 60 GHz frequency band wireless network is described below. Such implementation is useful with WirelessHD (WiHD) applications. WirelessHD is an industry-led effort to define a wireless digital network interface specification for wireless HD digital signal transmission on the 60 GHz frequency band, e.g., for consumer electronics (CE) and other electronic products. An example WiHD network utilizes a 60 GHz-band mmWave technology to support a physical (PHY) layer data transmission rate of multi-Gbps (gigabits per second), and can be used for transmitting uncompressed high definition television (HDTV) signals wirelessly. The wireless devices can have multiple antennas, wherein directional beams are formed for transmitting/receiving HD video information using OFDM. The present invention is useful with other wireless communication systems as well.

The wireless network 400 in FIG. 7 implements video transmission (e.g., high definition uncompressed video information) between wireless devices, such as a coordinator 412 and devices 414 (e.g., Dev1, . . . , DevN). In this example, the devices 414 utilize a low-rate wireless channel 416, and may use a high-rate channel 418 for communication therebetween. The coordinator 412 uses a low-rate channel 416 and a high-rate wireless channel 418, for communication with the devices 414. Each device 414 uses the low-rate channel 416 for communications with other devices 414. The high-rate channel 418 only supports single direction unicast transmission over directional beams established by beamforming with, e.g., multi-Gb/s bandwidth to support uncompressed HD video transmission. The low-rate channel 416 can support bi-directional transmission, e.g., with at most 40 Mbps throughput. The low-rate channel 416 is mainly used to transmit control frames such as ACK frames.

The wireless devices in the wireless network 400 utilize a frame format that implements a fragmentation pattern and unequal error protection with LDPC encoding, such as described above. A pair of wireless devices in the wireless network 400 can implement a communication process, such as described by example in relation to FIG. 5, according to an embodiment of the present invention.

Further, the present invention is useful with a wireless communication system including wireless communication stations, wherein each wireless communication station is capable of transmitting and/or receiving over a wireless channel. In FIG. 7, the coordinator 412 and each of the devices 414 are a type of wireless communication station. Therefore, a wireless communication station herein can function as a transmitter, a receiver, an access point, a coordinator, an initiator and/or a responder. In one example, transmission of packets over a wireless channel involves transmission by directional transmission beams over the high-rate wireless channel using OFDM. Further, in one example, the payload can comprise a MSDU which the PHY layer converts to a data unit frame, comprising a PPDU that implements payload fragmentation and LDPC encoding with unequal error protection, according to the present invention.

As is known to those skilled in the art, the aforementioned example architectures described above, according to the present invention, can be implemented in many ways, such as program instructions for execution by a processor, as logic circuits, as an application specific integrated circuit, as firmware, etc. The present invention has been described in considerable detail with reference to certain preferred versions thereof; however, other versions are possible. Therefore, the spirit and scope of the appended claims should not be limited to the description of the preferred versions contained herein.

What is claimed is:

1. A method of wireless data communication, comprising the steps of:
   constructing a data payload by partitioning the data into multiple fragments;
   performing block code encoding on each fragment, wherein at least one fragment is encoded at a different coding gain than another fragment;
   transmitting the data payload over a wireless channel; and
   selectively retransmitting data in said encoded fragments, indicated as received in error by a receiver when retransmission is enabled.

2. The method of claim 1, wherein constructing the data payload containing the data further includes appending a Media Access Control (MAC) header to the data payload to generate a MAC packet.

3. The method of claim 2, wherein:
   partitioning the data further includes partitioning the data into multiple fragments based on certain criteria; and
   performing block code encoding further includes performing low-density parity-check (LDPC) encoding on each fragment at a coding gain that is based on said criteria.

4. The method of claim 3, wherein:
   partitioning the data payload into fragments further includes partitioning the data payload based on multiple data importance levels; and
   performing LDPC encoding further includes performing LDPC encoding on each fragment at a coding gain that is based on the importance level of the data in that fragment, wherein more important data is provided with more error protection.

5. The method of claim 4, wherein:
   the data comprises video pixels;
   partitioning the data further includes partitioning the data based on the video importance level of the bits in each pixel component; and
   performing LDPC encoding further includes performing LDPC encoding on each fragment at a coding gain that is based on the importance level of the data in that fragment, wherein more important video bits are provided with more error protection.

6. The method of claim 5, wherein:
partitioning the data further includes partitioning the data based on the video importance level of the bits in each pixel component, such that the MSBs are placed in different fragments than the LSBs; and
performing LDPC encoding further includes performing LDPC encoding on each fragment that contains the MSBs at a coding gain that is higher than that of each fragment that contains the LSBs, wherein the MSBs are provided with more error protection.

7. The method of claim 5 wherein:
transmitting the data payload further includes appending a PHY (physical) header to the MAC packet to generate a data unit frame for transmission over a wireless channel; and
transmitting the payload further includes transmitting the data unit frame by directional transmission beams over a high-rate wireless channel.

8. The method of claim 1, wherein the payload comprises a MAC Service Data Unit (MSDU).

9. The method of claim 8, wherein the data unit frame comprises a PHY Protocol Data Unit (PPDU).

10. The method of claim 1, wherein transmitting the data payload includes transmitting the data payload including encoded fragments over a 60 GHz wireless channel.

11. A method of wireless data communication, comprising the steps of:
receiving a data payload comprising block code encoded data fragments over a wireless channel, wherein at least one fragment is encoded at a different coding gain than another fragment;
performing block code decoding on the data fragments in the data payload to detect data received in error; and
performing selective retransmission of the data received in error over a wireless channel.

12. The method of claim 11, wherein performing decoding further includes performing iterative decoding.

13. The method of claim 11, wherein performing selective retransmission further includes:
generating acknowledgement information that identifies the data received in error; and
transmitting the acknowledgment information over a wireless channel.

14. The method of claim 13 further comprising the steps of:
receiving the acknowledgment information; and
selectively retransmitting only the data identified in the acknowledgment information as received in error.

15. The method of claim 11, wherein receiving the data payload includes receiving a data payload comprising LDPC encoded data fragments over a 60 GHz wireless channel.

16. A wireless transmitter, comprising:
a framing module configured for constructing a data payload by partitioning the data into multiple fragments;
an encoder configured for performing block code encoding on each fragment, wherein at least one fragment is encoded at a different coding gain than another fragment;
a communication module configured for transmitting the data payload over a wireless channel; and
a retransmission module configured for selectively re-transmitting data in said encoded fragments, indicated as received in error by a receiver when retransmission is enabled.

17. The wireless transmitter of claim 16, wherein the framing module is further configured for appending a Media Access Control (MAC) header to the data payload to generate a MAC packet.

18. The wireless transmitter of claim 17, wherein:
the framing module is further configured for partitioning the data into multiple fragments based on certain criteria; and
the encoder is further configured for performing block code encoding on each fragment at a coding gain that is based on said criteria.

19. The wireless transmitter of claim 18, wherein:
the framing module is further configured for partitioning the data payload based on multiple data importance levels; and
the encoder is further configured for performing block code encoding on each fragment at a coding gain that is based on the importance level of the data in that fragment, wherein more important data is provided with more error protection.

20. The wireless transmitter of claim 19, wherein:
the data comprises video pixels;
the framing module is further configured for partitioning the data based on video importance level of the bits in each pixel component; and
the encoder is further configured for performing LDPC encoding on each fragment at a coding gain that is based on the importance level of the data in that fragment, wherein more important video bits are provided with more error protection.

21. The wireless transmitter of claim 20, wherein:
the framing module is further configured for partitioning the data based on the video importance level of the bits in each pixel component, such that the MSBs are placed in different fragments than the LSBs; and
the encoding module is further configured for performing LDPC encoding on each fragment that contains the MSBs at a coding gain that is higher than that of each fragment that contains the LSBs, wherein the MSBs are provided with more error protection.

22. The wireless transmitter of claim 20, wherein the communication module is further configured for appending a PHY (physical) header to the MAC packet to generate a data unit frame for transmission over a wireless channel, and transmitting the data unit frame by directional transmission beams over a high-rate wireless channel.

23. The wireless transmitter of claim 16, wherein the payload comprises a MAC Service Data Unit (MSDU).

24. The wireless transmitter of claim 23, wherein the data unit frame comprises a PHY Protocol Data Unit (PPDU).

25. The wireless transmitter of claim 16, wherein the communication module is configured for transmitting the data payload, including encoded fragments over a 60 GHz wireless channel.

26. A wireless receiver, comprising:
a communication module configured for receiving a data payload comprising block code encoded data fragments over a wireless channel, wherein at least one fragment is encoded at a different coding gain than another fragment;
a decoder configured for performing block code decoding on the data fragments in the data payload to detect data received in error; and
an acknowledgment module configured for requesting selective retransmission of the data received in error over a wireless channel.

27. The wireless receiver of claim 26, wherein the decoder is further configured for performing decoding by iterative decoding.

28. The wireless receiver of claim 26, wherein the acknowledgment module is further configured for generating acknowledgement information that identifies the data received in error, and transmitting the acknowledgment information over a wireless channel.

29. The wireless receiver of claim 26, wherein receiving the data payload includes receiving the data payload over a 60 GHz wireless channel.

30. The wireless receiver of claim 26, wherein the data is partitioned into multiple fragments based on certain criteria and each fragment is LDPC encoded at a coding gain that is based on said criteria.

31. The wireless receiver of claim 30, wherein the data is partitioned into fragments based on multiple data importance levels and each fragment is LDPC encoded at a coding gain that is based on the importance level of the data in that fragment, wherein more important data is provided with more error protection.

* * * * *